(12) United States Patent
Woolaway et al.

(10) Patent No.: US 7,749,690 B2
(45) Date of Patent: Jul. 6, 2010

(54) DIE IDENTIFICATION SYSTEMS AND METHODS

(75) Inventors: James T. Woolaway, Goleta, CA (US);
Glenn T. Kincaid, Santa Barbara, CA (US); Eric A. Kurth, Santa Barbara, CA (US); Robert F. Zausch, Pocatello, ID (US); Glenn E. Williams, Pocatello, ID (US)

(73) Assignee: Flir Systems, Inc., Wilsonville, OR (US)

( * ) Notice: Subject to any disclaimer, the term of this patent is extended or adjusted under 35 U.S.C. 154(b) by 1759 days.

(21) Appl. No.: 10/883,316

(22) Filed: Jun. 30, 2004

(65) Prior Publication Data

US 2006/0003234 A1    Jan. 5, 2006

(51) Int. Cl.
*G03C 5/00* (2006.01)

(52) U.S. Cl. .................... 430/394; 430/311; 257/620; 257/797

(58) Field of Classification Search .......... 430/5, 430/22, 311–313, 322, 394; 257/65, 797, 257/620; 438/128
See application file for complete search history.

(56) References Cited

U.S. PATENT DOCUMENTS

| | | | | |
|---|---|---|---|---|
| 4,343,877 A | * | 8/1982 | Chiang | 430/5 |
| 4,442,188 A | * | 4/1984 | Chiang | 430/5 |
| 5,294,812 A | * | 3/1994 | Hashimoto et al. | 257/65 |
| 5,302,491 A | * | 4/1994 | Akylas et al. | 430/311 |
| 5,705,299 A | | 1/1998 | Tew et al. | |
| 6,806,035 B1 | * | 10/2004 | Atireklapvarodom et al. | 430/313 |
| 6,888,260 B2 | * | 5/2005 | Carpi et al. | 257/797 |
| 2003/0209812 A1 | * | 11/2003 | Nin | 257/797 |
| 2004/0082139 A1 | * | 4/2004 | Kim et al. | 438/401 |
| 2005/0112474 A1 | * | 5/2005 | Sandstrom | 430/5 |

* cited by examiner

*Primary Examiner*—Mark F Huff
*Assistant Examiner*—Stewart A Fraser
(74) *Attorney, Agent, or Firm*—Haynes and Boone, LLP

(57) ABSTRACT

Systems and methods are disclosed herein to provide die identification. For example, in accordance with an embodiment of the present invention, a wafer patterning technique is disclosed that provides multiple-exposure patterning to provide a unique identifying mark for each die on a wafer.

11 Claims, 3 Drawing Sheets

DIE IDENTIFICATION SYSTEMS AND METHODS

TECHNICAL FIELD

The present invention relates generally to integrated circuits and, more particularly, to integrated circuit fabrication.

BACKGROUND

Semiconductor processing techniques are well known for manufacturing modern integrated circuits. A typical procedure in the manufacturing process includes photolithography, which involves passing light through a reticle (also referred to as a mask) to expose a layer's image for one or more die on a wafer. The wafer is "stepped" or moved and the photolithographic process repeated until the pattern of the reticle has been replicated on all of the die on the wafer (e.g., a step-and-repeat process performed by a stepper machine).

One drawback of a conventional photolithographic process, such as with die patterning performed using a single-stepped reticle set exposure, is that it is not possible to provide a unique identification for each die on the wafer. This is because the same reticle is exposed in multiple locations and results in the same pattern at each location (i.e., each die will have approximately an identical pattern at the end of the photolithographic process). Being able to uniquely identify each die on a wafer, even after the die have been separated from the wafer, may provide certain advantages, such as for example in terms of yield analysis and tracking of the die during and after the test, assembly, and packaging process. As a result, there is a need for improved semiconductor processing techniques.

SUMMARY

Systems and methods are disclosed herein to provide die identification. For example, in accordance with an embodiment of the present invention, a wafer patterning technique is disclosed that provides multiple-exposure patterning to provide a unique identification for each die on a wafer. For example, a die identification block is patterned on each die on a wafer, with a marker patterned on (or over) the die identification block of each die to indicate each die's location on the wafer. The patterning for the marker may be performed, for example, through multiple-exposure patterning.

More specifically, in accordance with one embodiment of the present invention, an integrated circuit includes a die having at least a first layer and a second layer; an identification pattern on a first layer of the die; and a marker on the second layer of the die, wherein a location of the marker relative to the identification pattern indicates a corresponding location of the die on a wafer.

In accordance with another embodiment of the present invention, a method of providing identifying marks to die on a wafer includes providing an identification pattern on a first layer of the die; and providing a marker on a second layer of the die, the second layer applied subsequent to the first layer, wherein a location of the marker relative to the identification pattern for each of the die indicates a corresponding location of the die on the wafer.

In accordance with another embodiment of the present invention, a reticle includes a first pattern for exposing a first portion of a layer of a die on a wafer; and a second pattern for exposing a second portion of the layer of the die on the wafer, wherein the second pattern is adapted to indicate a location of the die on the wafer.

In accordance with another embodiment of the present invention, a reticle includes a first pattern for exposing a first portion of a layer of a die on a wafer; and a second pattern for exposing a second portion of the layer of the die on the wafer, wherein the second pattern comprises a marker whose location within the second portion of the layer indicates a corresponding location of the die on the wafer.

In accordance with another embodiment of the present invention, an integrated circuit comprises a die having at least a first layer; and an identification pattern on the first layer, wherein the identification pattern indicates a previous location of the die on a wafer.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
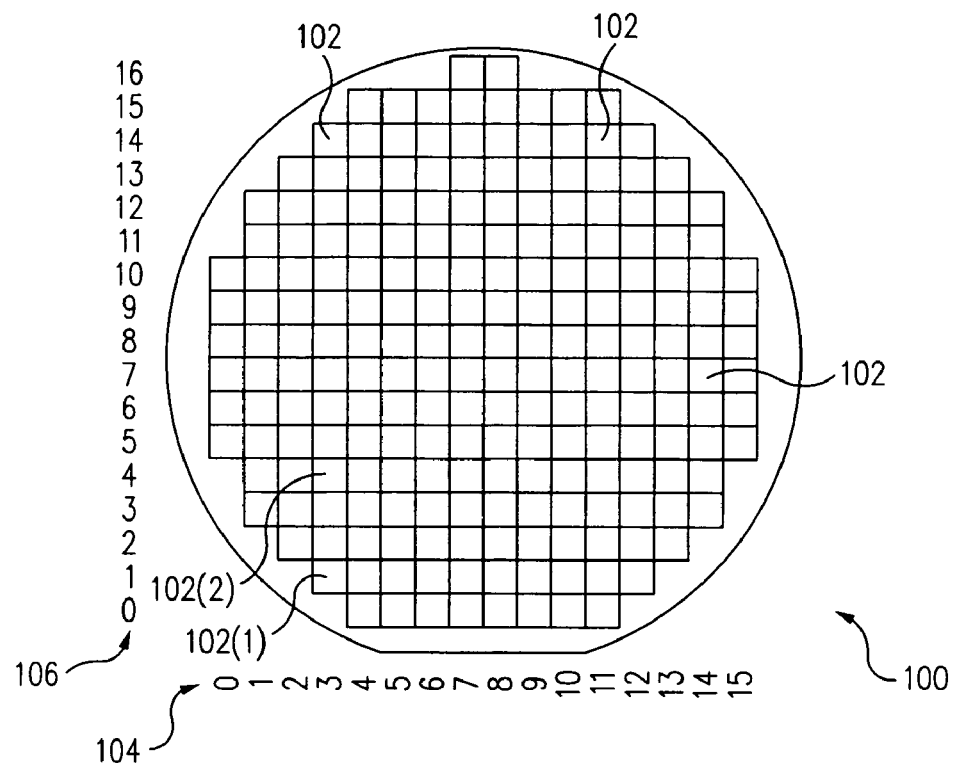
FIG. 1 shows a block diagram illustrating an exemplary wafer in accordance with an embodiment of the present invention.

FIG. 1 shows a block diagram illustrating an exemplary wafer 100 in accordance with an embodiment of the present invention. Wafer 100 is shown with an exemplary wafer stepping plan to produce a number of die 102 on wafer 100. Also shown in FIG. 1 are exemplary column numbers 104 (e.g., columns 0 through 15) and exemplary row numbers 106 (e.g., rows 0 through 16). Column numbers 104 and row numbers 106 may be utilized to identify a location of each die 102 on wafer 100 (e.g., die 102 at row 1 and column 3 which is separately referenced as die 102(1)).

Each die 102 on wafer 100, in accordance with an embodiment of the present invention, may be patterned by employing a multiple-exposure patterning technique (e.g., a silicon wafer multiple-exposure patterning technique if wafer 100 is silicon based) to uniquely identify each die 102 on wafer 100. Consequently, the location of each die 102 on wafer 100 will be known, even after all of die 102 are separated from wafer 100, which may provide certain advantages or information that is useful for example in terms of yield analysis and tracking of the die during and after the test, assembly, and packaging process.

In general, in accordance with an embodiment of the present invention, the multiple-exposure patterning technique provides a die identification pattern (or grid) on a lower layer of an integrated circuit. A marker is then positioned over the die identification pattern in a subsequent upper layer of the integrated circuit to uniquely identify the location of the integrated circuit (e.g., one of die 102 on wafer 100) on the wafer.

As an example, the marker may be placed in the upper layer by performing a two-pass exposure. The first pass exposure does not disturb the resist above the die identification pattern, but may be used to pattern the remaining portion of the die for that layer. For the resist not to be disturbed, for example, if a positive-resist process is being utilized, the first pass exposure does not allow light (e.g., ultraviolet light) through to the resist above the die identification pattern (i.e., the resist is not degraded). The second pass exposure disturbs the resist above the die identification pattern to mark at a certain corresponding location above the die identification pattern and uniquely identify the die on the wafer and to identify the location of the die on the wafer relative to the other die.

Figure 2:
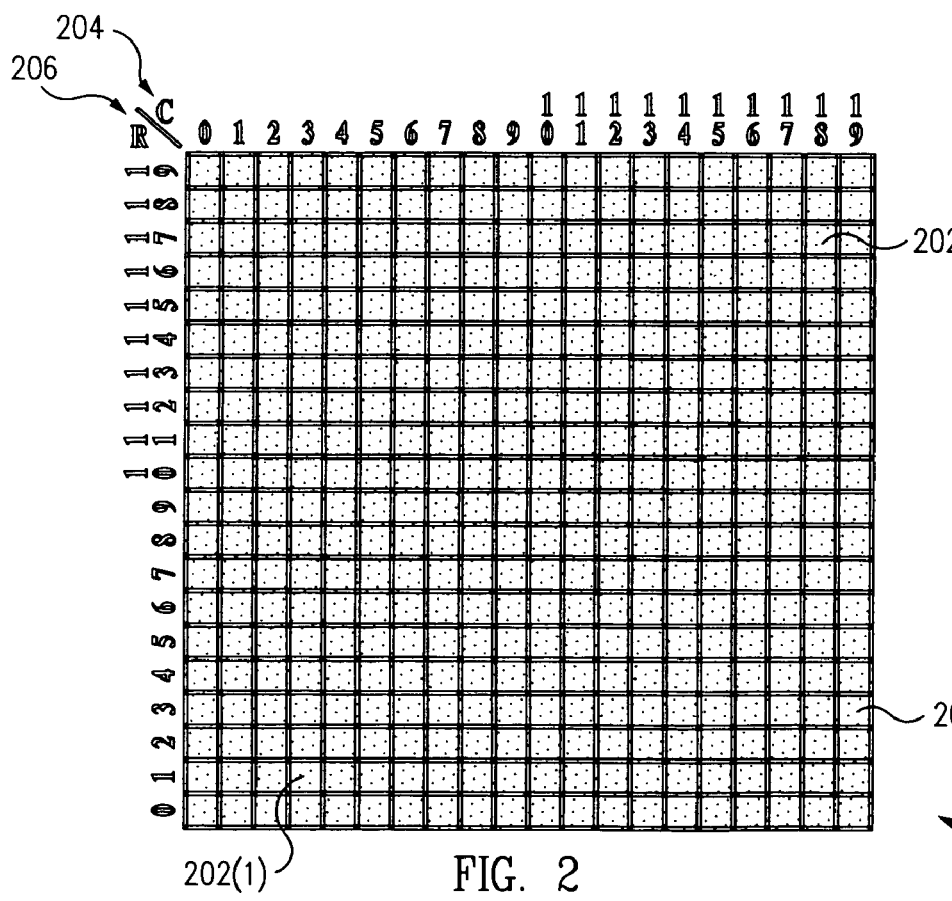
FIG. 2 shows a block diagram illustrating an exemplary die identification block in accordance with an embodiment of the present invention.

FIG. 2 shows a block diagram illustrating an exemplary die identification pattern 200 in accordance with an embodiment of the present invention. Die identification pattern 200 illustrates an exemplary grid pattern (or die identification block) to allow the marking of unique grid locations 202 corresponding to locations of die on a wafer. As shown in FIG. 2, grid locations 202 may be identified by utilizing exemplary column (C) numbers 204 (e.g., columns 0 through 19) and row (R) numbers 206 (e.g., rows 0 through 19), with column numbers 204 and row numbers 206 corresponding to column numbers 104 and row numbers 106 that specify locations of die 102 on wafer 100 (FIG. 1).

As an exemplary implementation, die identification pattern 200 may be patterned on a lower layer of die on a wafer. A marker may then be patterned on an upper layer of the die over die identification pattern 200, with the marker uniquely positioned over the die identification pattern 200 for each die to correspond to the location of the die on the wafer.

For example, die identification pattern 200 may be patterned on a layer of each die 102 on wafer 100 (FIG. 1). A marker may then be patterned on an upper layer of each die 102 over die identification pattern 200. The marker, for example, is positioned over one of grid locations 202 corresponding to the location of each die 102 on wafer 100.

As a specific example, die 102(1), located on wafer 100 at row 1 and column 3 in FIG. 1, would have its marker placed over grid location 202 at row 1 and column 3 (which is separately referenced as grid location 202(1)) of die identification pattern 200. Thus, each die 102 on wafer 100 would be uniquely identified and its location on wafer 100 specified by having its marker located over die identification pattern 200 at one of grid locations 202 corresponding to the location of each die 102 on wafer 100. Die identification pattern 200 may serve as a map of wafer 100, with the marker specifying the location of the corresponding die 102 on wafer 100.

As a specific implementation example (referring to FIGS. 1 and 2), a die identification pattern 200 may be patterned on die 102 (primary die) of wafer 100 on a second metal layer of a three metal layer process. A marker may be patterned over die identification pattern 200 (using a two-pass exposure) to indicate the corresponding position of each die 102 on wafer 100. The marker, for example, may be stepped and micro-positioned in the third metal layer, with the marker for example being unexposed photo resist while the remaining photo resist over die identification pattern 200 is exposed so that die identification pattern 200 is discernible except for the location of the marker.

For the two-pass exposure, for example, the primary die reticle may contain a region of unexposed photo resist (e.g., for a positive resist process), which allows a subsequent exposure for die identification purposes (i.e., with the subsequent exposure for patterning the marker in the previously unexposed photo resist). Thus, for example, the subsequent exposure for die identification purposes may be performed by appropriate shuttering of the primary die reticle containing the marker (i.e., marker patterning) to allow light through to expose the photo resist over die identification pattern 200 except for the specific location of the marker.

Figure 3:
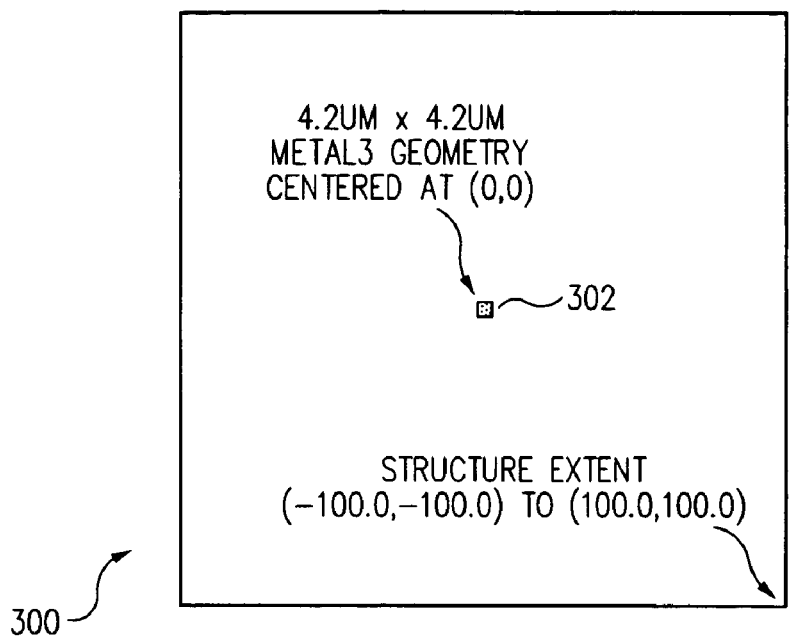
FIG. 3 shows a block diagram illustrating an exemplary marker in accordance with an embodiment of the present invention.

As an example, FIG. 3 shows a block diagram illustrating an exemplary marker layout 300 in accordance with an embodiment of the present invention. Marker layout 300, as an example, includes an exemplary marker 302, which can be positioned within a boundary of 200 by 200 microns (e.g., corresponding to the size of die identification pattern, such as die identification pattern 200, such that the die identification pattern may be completely exposed except for the desired marker regardless of the marker location).

Marker 302, for example, has dimensions of 4.2 by 4.2 microns and is shown positioned in marker layout 300 at its center (e.g., at point (0,0) within the boundary having a structure extent of (−100,−100) to (100,100)). If the die identification pattern is 200 by 200 microns, with a pitch of 5 microns (e.g., each grid location 202 is 5 by 5 microns), marker 302 may be positioned within any of the grid locations of the die identification pattern. For the specific implementation example of a three metal layer process, marker 302 would be located in the third metal layer geometry (i.e., a metal 3 geometry).

Figure 4:
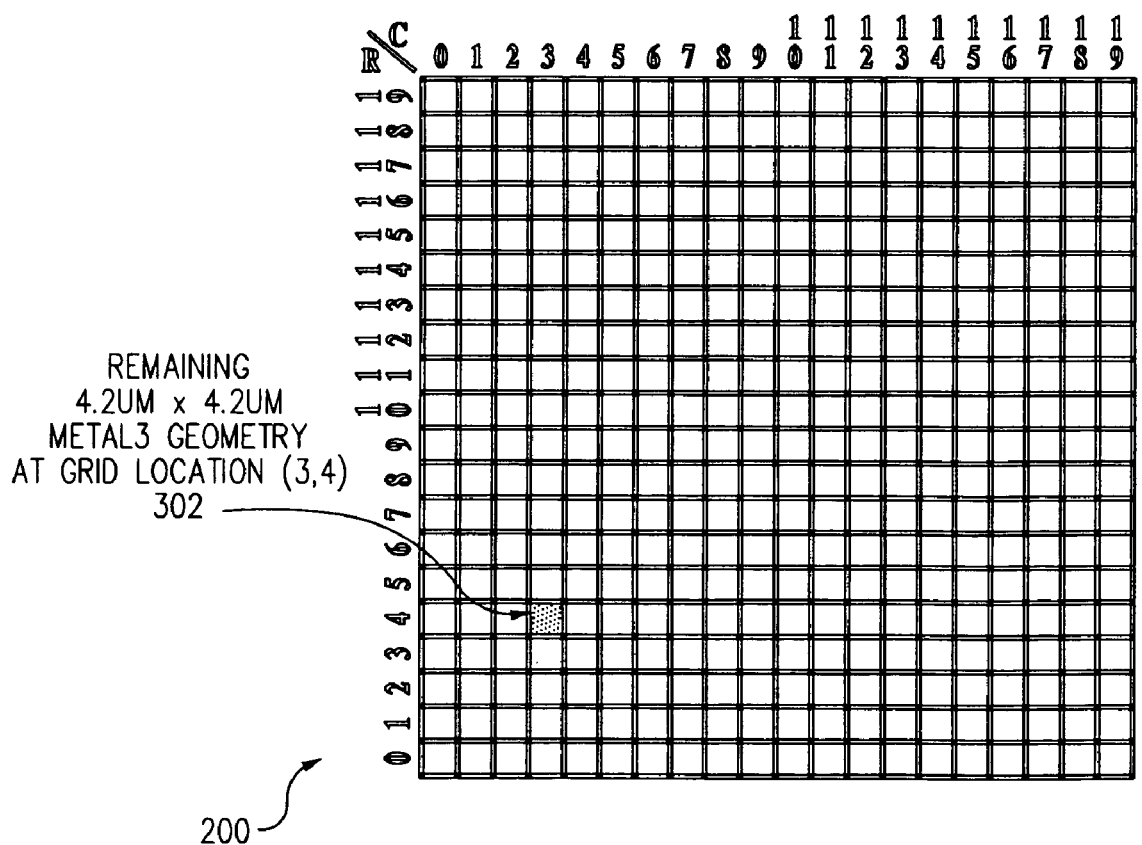
FIG. 4 shows a block diagram illustrating an exemplary die identification block with a marker in accordance with an embodiment of the present invention.

FIG. 4 shows a block diagram illustrating die identification block 200 with marker 302 in accordance with an embodiment of the present invention. Marker 302, as an example, is located within grid location 202 at column 3 and row 4 (i.e., grid location (3,4)). Thus, for example, die identification block 200 with marker 302 at grid location (3,4), as shown in FIG. 4 (e.g., a desired resulting exposure pattern), would be patterned on die 102 at column 3 and row 4 (which is separately referenced in FIG. 1 as die 102(2)) to uniquely identify die 102(2) and its location on wafer 100.

Marker 302, for example, may be uniquely positioned over die identification block 200 within each die 102 via a multiple-exposure patterning. For example, the first pass exposure patterning for the layer that includes marker 302 on each die 102 may be performed in a conventional fashion, except that a region of photo resist (e.g., in the final layer of metal) is left unexposed (i.e., for a positive-resist process) over die identification block 200. The second pass exposure patterning then exposes this region of photo resist, leaving marker 302 (e.g., a row/column marker) over die identification block 200 located below (e.g., in a lower layer metal). Consequently, an exposure region is provided around marker 302 such that for each desired location of marker 302 relative to die identification block 200, the photo resist is exposed to remove the photo resist over die identification block 200 so that the entire die identification block 200 is visible except for the specific location of marker 302.

To uniquely position marker 302 over die identification block 200 on each die 102, a stepping distance for marker 302 that is slightly different than the primary die stepping distance may be utilized, resulting in a unique location of marker 302 on each die 102.

Figure 5:
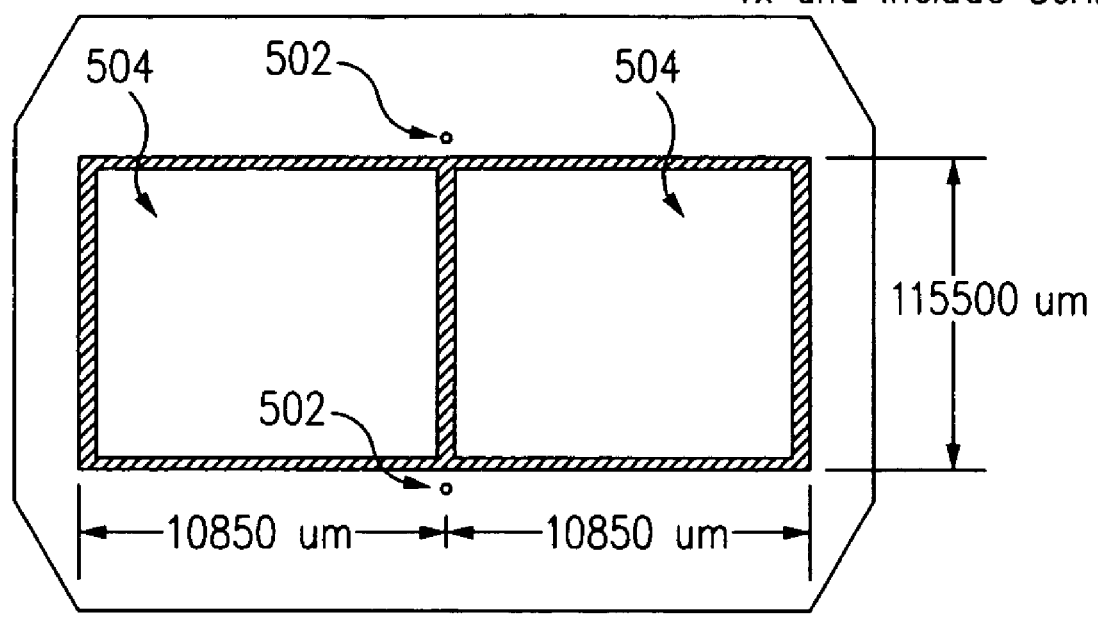
FIG. 5 shows a block diagram illustrating an exemplary reticle plan in accordance with an embodiment of the present invention.

FIG. 5 shows a block diagram illustrating an exemplary reticle 500 in accordance with an embodiment of the present invention. Reticle 500, for example, may include one or more marker patterns 502 (e.g., row and/or column marker exposure patterns) along with one or more mask patterns 504 (e.g., primary die exposure patterns) that are to be utilized to expose the resist for the desired pattern on the same layer as the marker layer.

For example, one or more of mask patterns 504 on reticle 500 may be utilized to expose the resist for the areas that are not above the die identification grid (e.g., die identification block 200). Reticle 500 would then also be positioned over the die identification grid (e.g., on a subsequent exposure) to expose the resist over the die identification grid and uniquely position the marker (e.g., one of marker patterns 502) for each die on the wafer. Various conventional techniques, such as shuttering, may be utilized to appropriately select the desired pattern or marker for die exposure for each pass of the reticle. Furthermore, marker pattern 502 provides an exposure pattern to provide a marker (e.g., marker 302) while exposing the photo resist around the marker and above the die identification grid so that the die identification grid is visible except for the location of the marker (e.g., the unexposed photo resist) over the die identification grid.

More than one marker patterns 502 may be implemented on reticle 500, for example, to accommodate wafer movement limitations (e.g., only one of marker patterns 502 is selected based on desired location of marker pattern 502 relative to the die identification grid). More than one marker pattern 502 may also be implemented such that a unique marker pattern 502 is provided to correspond to each die on the wafer, as discussed further herein.

In accordance with an embodiment of the present invention, a technique for uniquely identifying each die on a wafer is disclosed. For example, a die identification block containing a grid and/or identifying characters may be located in a lower layer (e.g., a metal 2 layer), with a sacrificial geometry located in a layer (e.g., a metal 3 layer) above the die identification block for the placement of a marker.

As an implementation example, if each die on a wafer has a size of 10,000 by 10,000 microns and a coordinate center at (5,000, 5,000), a die identification grid (e.g., die identification block 20b) may be located on each die at (−4,500, 4,500) offset from the coordinate center. A row/column marker structure (e.g., marker 302 and named ROWCOLMARK and stored in a ROWCOLMARK.GDS file) contains a single metal 3 geometry (e.g., if the marker is located in the metal 3 layer) of 4.2 by 4.2 microns centered at a coordinate (0,0), with an exposure window of 200 by 200 microns. Therefore, for a primary die size of 10,000 by 10,000 microns, a scribe width of 200 horizontal by 200 vertical microns (size of the die identification grid), and a die identification grid location size of 5 horizontal by 5 vertical microns, an exemplary stepping distance of the row/column marker structure may be 10,205 microns (10,000+200+5) in the horizontal (X) and vertical (Y) directions.

In general, in accordance with one or more embodiments of the present invention, systems and methods are disclosed for providing identification markings on die of a wafer. The identification markings may be placed on one die, a number of die, or all of the die on the wafer. For example, the techniques disclosed herein may be applied as a silicon wafer patterning technique to provide a unique identification for each die on the wafer via multiple exposure patterning.

The identifying mark, in accordance with an embodiment of the present invention, may be applied to a layer above an identification grid. Alternatively, rather than an identification grid located in a lower layer, the reticle may have a number of unique markings or marking patterns (e.g., numbers, letters, or identification grids with markers) to uniquely mark corresponding ones of the die on the wafer. Thus, all of the marking patterns will be shuttered except for the marking pattern corresponding to the specific die on the wafer that is to be exposed with that specific marking pattern for identification.

It should also be understood that one or more of the embodiments discussed herein are not limited to photolithography. For example, any system or method, in addition to optical lithography, extreme ultraviolet lithography, and immersion lithography, which may be employed to apply a pattern to a die may be applicable to the techniques discussed herein.

Embodiments described above illustrate but do not limit the invention. It should also be understood that numerous modifications and variations are possible in accordance with the principles of the present invention. Accordingly, the scope of the invention is defined only by the following claims.

We claim:

1. A method of providing identifying marks to die on a wafer, the method comprising:
    providing an identification pattern on a first layer of the die; and
    providing a marker on a second layer of the die using a multiple-exposure patterning process for the second layer, the second layer applied subsequent to the first layer, wherein a location of the marker relative to the identification pattern for each of the die indicates a corresponding location of the die on the wafer such that the corresponding location is known after separation of the die from the wafer, and wherein the providing of the marker comprises; applying a first image to the second layer except for a region above the identification pattern; and applying a second image to the second layer in the region above the identification pattern to provide the marker.

2. The method of claim 1, wherein the identification pattern comprises a grid having a number of columns and a number of rows, the location of the marker at an intersection of one of the columns and one of the rows corresponds to the location of the die in a corresponding column and a corresponding row on the wafer.

3. The method of claim 1, wherein the is formed of photoresist marker.

4. The method of claim 1, wherein the applying the second image to provide the marker is performed in a different photo resist exposure pass for the second layer than the applying the first image to the second layer.

5. An integrated circuit comprising:
    a die having at least a first layer and a second layer;
    an identification pattern on the first layer of the die; and
    a marker on the second layer of the die, wherein a location of the marker relative to the identification pattern indicates a corresponding location of the die on a wafer from which the die was separated; wherein the first and second layers are metal layers, the second layer above the first layer, and wherein the integrated circuit comprises:
    a circuit pattern on the second layer of the die, wherein the circuit pattern is on a portion of the second layer that is not directly over the identification pattern on the first layer of the die; and wherein the marker on the second layer of the die is positioned directly over the identification pattern on the first layer of the die, with the circuit pattern and the marker formed by a multiple-pass exposure process for the second layer.

6. The integrated circuit of claim 5, wherein the identification pattern comprises a grid having a number of columns and a number of rows, the location of the marker at an intersection of one of the columns and one of the rows corresponds to the location of the die in a corresponding column and a corresponding row on the wafer from which the die was separated.

7. The integrated circuit of claim 5, wherein the marker is made of photo resist second layer above the first layer, and wherein the integrated circuit further comprises.

8. An integrated circuit comprising:
 a die having at least a first layer; and a marker on a second layer of the die; and
 an identification pattern formed from photo resist on the first layer, wherein a location of the marker relative to the identification pattern indicates a previous location of the die on a wafer; wherein the marker on the second layer of the die is positioned relative to the identification pattern on the first layer of the die to provide the location of the die on the wafer from which the die was separated, and wherein the second layer of the die further includes a circuit pattern disposed on a portion of the second layer so as to not obscure the identification pattern on the first layer of the die relative to the marker on the second layer of the die.

9. The integrated circuit of claim 8, wherein the identification pattern comprises a marker, a number, a character, a letter, and/or a grid.

10. The integrated circuit of claim 8, wherein the identification pattern was formed during a multiple-exposure patterning.

11. The integrated circuit of claim 10, wherein the marker is formed from photo resist.

* * * * *